United States Patent [19]

Machida et al.

[11] Patent Number: 4,709,211
[45] Date of Patent: Nov. 24, 1987

[54] NUCLEAR MAGNETIC RESONANCE SYSTEM

[75] Inventors: Yoshio Machida, Nishi-Nasunomachi; Takao Kasugai, Otawara, both of Japan

[73] Assignee: Kabushiki Kaisha Toshiba, Kawasaki, Japan

[21] Appl. No.: 884,504

[22] Filed: Jul. 11, 1986

[30] Foreign Application Priority Data

Jul. 11, 1985 [JP] Japan .................................. 60-151342

[51] Int. Cl.[4] ............................................. G01R 33/20
[52] U.S. Cl. ................................................... 324/309
[58] Field of Search ......................................... 324/309

[56] References Cited

U.S. PATENT DOCUMENTS

| | | | |
|---|---|---|---|
| 4,070,611 | 1/1978 | Ernst | 324/312 X |
| 4,355,282 | 10/1982 | Young et al. | 324/309 |
| 4,506,222 | 3/1985 | Edelstein et al. | 324/309 |
| 4,509,015 | 4/1985 | Ordidge et al. | 324/309 |
| 4,520,315 | 5/1985 | Loeffler et al. | 324/309 |
| 4,587,489 | 5/1986 | Wehrli | 324/309 |
| 4,593,246 | 6/1986 | Glover | 324/309 |
| 4,602,214 | 7/1986 | Edelstein et al. | 324/309 |
| 4,609,872 | 9/1986 | O'Donnell | 324/309 X |
| 4,649,345 | 3/1987 | Yoda et al. | 324/309 |
| 4,654,593 | 3/1987 | Ackerman | 324/309 |

*Primary Examiner*—Tom Noland
*Attorney, Agent, or Firm*—Schwartz, Jeffery, Schwaab, Mack, Blumenthal & Evans

[57] ABSTRACT

A Fourier transformation imaging technique is used for NMR imaging. Spins in a selected plane are excited by selective RF pulses and an associated $G_z$ gradient and the selected spins are subjected to three mutually orthogonal gradients which provide the resonance signal with spatial resolution along each axis produced by phase encoding. The signals sampled and read out in the presence of a readout gradient are associated with spatial frequencies determined by the applied gradient fields. The Fourier transformation of the spin-echo signals obtained from repetition of the pulse sequences gives a two-dimensional image. The linear phase-encoding gradient is applied starting with a preliminary phase-encoding gradient which maximizes the spin-echo signals.

5 Claims, 6 Drawing Figures

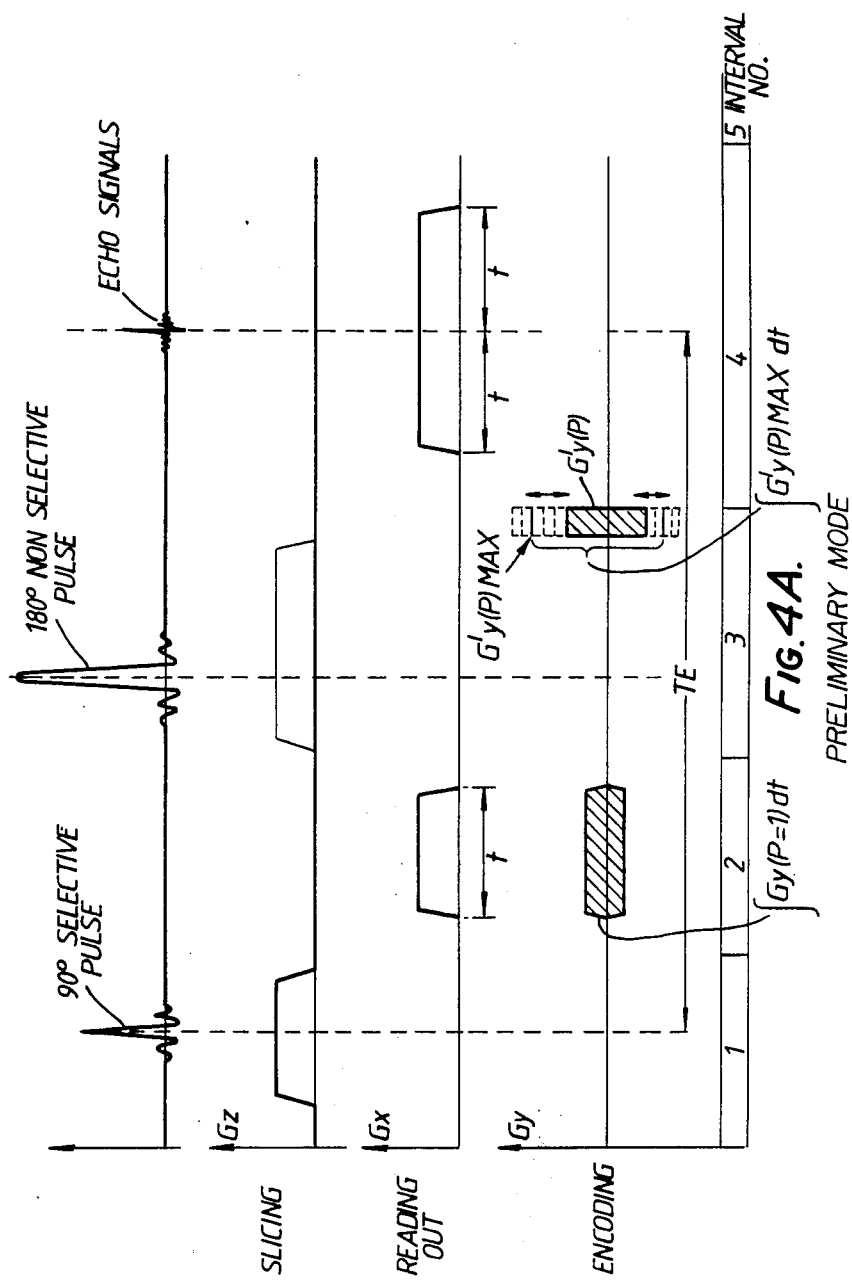

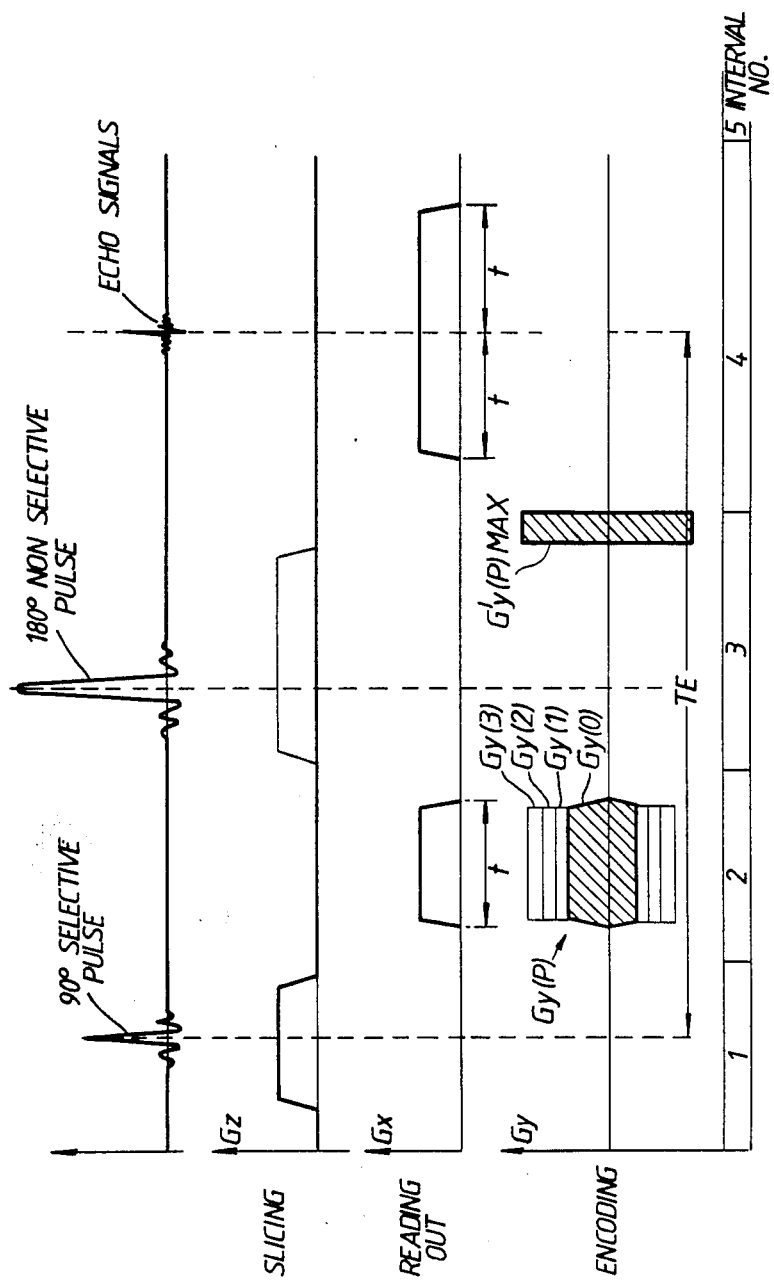
FIG. 4B. IMAGE MEASUREMENT MODE

NUCLEAR MAGNETIC RESONANCE SYSTEM

BACKGROUND OF THE INVENTION

The present invention relates to nuclear magnetic resonance imaging systems for providing images of distributions of a chosen quantity in a selected region of a body. The examination may be of many different kinds of bodies but a particular application, to which much attention has been given, is medical examination of patients.

For NMR examinations, suitable combinations of magnetic fields are applied to the object to be examined by approriate magnetic coil systems. Excited material within the object is then detected by currents induced in one or more detector coils and are analyzed to provide the required distribution.

Various schemes have been proposed for this purpose. Relevant background references are the disclosures of Edelstein and Hutchison et al in *Physics in Medicine & Biology* Vol. 25, No. 4, pp. 751-756 (July 1980) and U.S. Pat. Nos. 4,070,611 and 4,431,968 the entirety of each document incorporated herein by reference.

The imaging sequence used for the spin warp NMR imaging proposed by Edelstein et al, shown in FIG. 1, produces spin-echo images with transaxial orientation. The sequence begins when sine-modulated 90° nutation pulse (A) occurs simultaneously with a $G_z$ gradient pulse to produce the spatially selective excitation of nuclear spins. Additional gradient pulses are applied: $G_y$ phase encodes in-plane resolution, $G_z$ phase encodes an image section, and $G_x$ defocuses the free induction decay (FID) to temporally center the later occurring spin-echo signal. A 180° RF pulse (C) occurs simultaneously with a $G_z$ gradient pulse to produce echo refocusing. A read-out gradient $G_x$ frequency encodes (D) the spin-echo signal for resolution along an in-plane axis. The two-dimensional (2D) images were made by iteration of the pulse sequence each time with a different magnitude of $G_y$ at (B).

Each of the above described cycles of the pulse sequence is repeated several times (N) for signal averaging and to cancel FID artifacts which are produced by FID signals active during the spin-echo period but generated by the 90° irradiation of adjacent planar regions outside the selected plane or inner volume chosen for study. To produce the described images, the gradient pulses $G_z$ and $G_x$ are interchanged.

It should be appreciated that the above-described techniques is disadvantageous in various aspects. For example, in the spin warp NMR imaging or Fourier zeugmatography known from U.S. Pat. No. 4,070,611, two phase encoding magnetic gradients must be varied linearly in the respective directions so as to obtain the image information in dependence upon the linear variation between the intensity of the magnetic fields and the corresponding coordinates. However, in practice, the linearity depends on various instrumental parameters, such as the quality of the magnetic field coils, the power supply for the coils, etc. Therefore, in practice, the intensity of the gradient fields is not varied in a linear manner around the origin which is the point in which the gradients contribute to the external static field. This unaviodable non-linearity especially near the zero field origin of the gradient fields causes artifacts in the reconstructed NMR images.

SUMMARY OF THE INVENTION

It is an object of this invention to provide an improved method for producing nuclear magnetic response image data.

More specifically, an object of the present invention is to provide a method which eliminates artifacts due to the above described non-linearity in the gradient, and includes a correction factor to correct variation of the intensity of the magnetic gradient along an axis prior to collection of the signals required for forming an image of the magnetization distribution using the Fourier zeugmatography technique.

According to the invention, prior to the collection of the spin-echo resonance signal produced by the 180° pulse when the so-called spin-echo technique is used, (which is subject to a 2D Fourier transformation to obtain an image of the magnetization distribution in the selected slice), a preliminary modulated phase encoding gradient field is applied in a preliminary mode of operation, so that several preliminary and reference echo signals are obtained by sampling operations performed in the presence of the preliminary gradient magnetic fields. Then, in the actual image measurement mode the intensity of the gradient determined in the preliminary mode is used as the origin or minimum value of the phase encoding gradient pulse sequence for collecting the echo signals actually used for forming the desired imaging.

In accordance with the invention, there is provided a method of deriving image information from an object using nuclear magnetic resonance signals comprising the steps of:

(A) subjecting an object to a static magnetic field along an axis and performing a set of sequential preliminary steps including:
  (1) selectively exciting nuclear spins in a selected plane in the presence of a first gradient magnetic field oriented along said axis;
  (2) applying a second grdient magnetic field for encoding the phase of the selected spins to spatially resolve information along another axis being orthogonal to the direction of the first axis;
  (3) applying a preliminary third gradient magnetic field having a direction orthogonal to the direction of both the first and second axes;
  (4) applying a 180° RF pulse associated with the first gradient to produce echo refocusing;
  (5) applying an additional preliminary third gradient after said 180° RF pulse;
  (6) removing the additional third gradient;
  (7) applying a further second gradient;
  (8) measuring a spin-echo signal in the presence of said further second gradient;
  (9) repeating the sequence of steps (1)-(8) a plurality of times while applying a different value of the preliminary third gradient each time and while storing the respective measured values of the spin-echo signal;
  (10) selecting one of said stored values of the spin-echo signal in accordance with a predetermined criteria;
  (11) determining the value of said additional preliminary third gradient $G'_y(p)MAX$ which corresponds to said selected value of said spin-echo signal; and
(B) subjecting the object to said static magnetic field and performing the measurement steps of:

(12) selectively exiting nuclear spins in said selected plane in the presence of said first gradient magnetic field;

(13) applying said second gradient magnetic field;

(14) applying a third gradient magnetic field having a direction orthogonal to the direction of both the first and second axes;

(15) applying a 180° RF pulse associated with the first gradient to produce echo refocusing;

(16) applying an additional third gradient after said 180° RF pulse, said additional third gradient having a value $G'_y(p)MAX$ determined in said preliminary steps;

(17) removing the additional third gradient;

(18) applying a further second gradient;

(19) measuring a spin-echo signal in the presence of said further second gradient;

(20) repeating the sequence of steps (12)-(19) a plurality of times while applying a different value of the third gradient in step (14) while storing the respective measured values of the spin-echo signals; and

(21) processing the stored values of the spin-echo signal for determining an NMR image of said object.

BRIEF DESCRIPTION OF THE DRAWINGS

The invention will be described in detail hereinafter with reference to the embodiments shown in the drawing therein:

FIGS. 4A and 4B show the pulse sequence and spin-echo signals provided in accordance with the method of the invention.

DETAILED DESCRIPTION OF THE PREFERRED EMBODIMENTS

Figure 1:
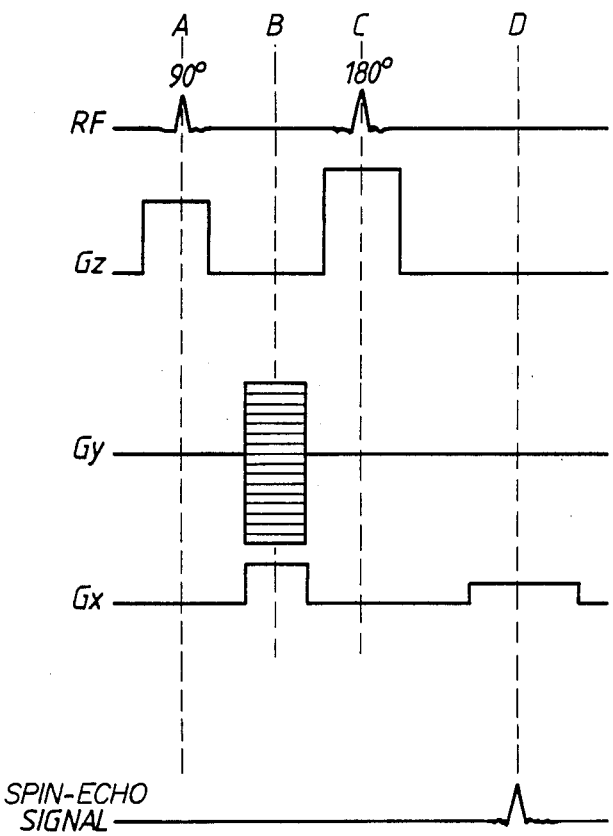
FIG. 1 shows the pulse sequence of a spin warp NMR imaging method.
Figure 2:
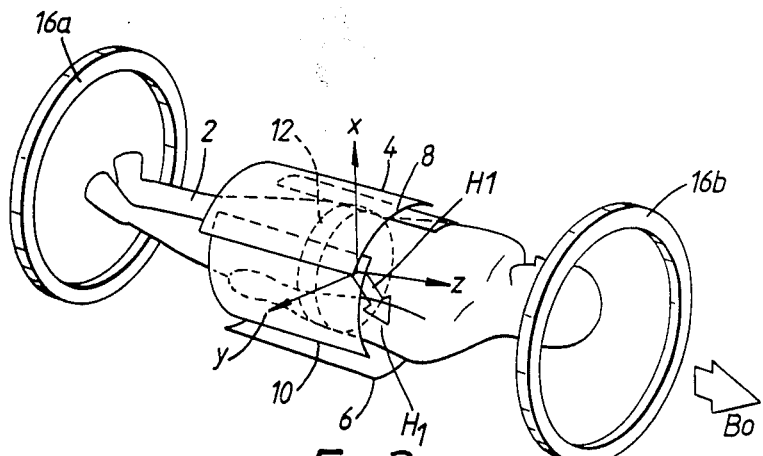
FIG. 2 diagrammatically illustrates the location of a target within magnetic field generating coils.

Referring to FIG. 2, a target or object to be investigated is placed in a static magnetic field $B_o$ which extends in the Z-direction. RF transmitter coils 4 and 6 and RF receiver coils 8 and 10 are shown, for example, to consist of two separate coil sets that are electrically orthogonal to one another and which generate RF magnetic field pulses having the required modulation to excite resonance in a planar slice 12 of the object. The object slice is defined by the combination of the application of the static field $B_o$ and the magnetic field gradient $G_z$ along the Z-direction produced by Z-axis gradient coils 16a and 16b. RF magnetic field pulses are directed orthogonal to the $B_o$ field. The Z-axis gradient coils 16a and 16b are in the form of Helmholtz pairs wound in opposition, and are disposed substantially in planes perpendicular to the Z axis. In addition to $G_z$ gradient coils 16a and 16b, two additional gradient coil sets provide field gradients $G_x$, and $G_y$, respectively for encoding the phase of the spin-echo signals for image reconstruction to spatially resolve information along each axis. For the sake of clarity, the $G_x$ and $G_y$ gradient coil sets are only shown schematically as 16c, 16d, 16e and 16f, respectively, in FIG. 3, but are shown in more detail, for example, in the U.S. Pat. No. 4,355,282 which is incorporated herein by reference.

Figure 3:
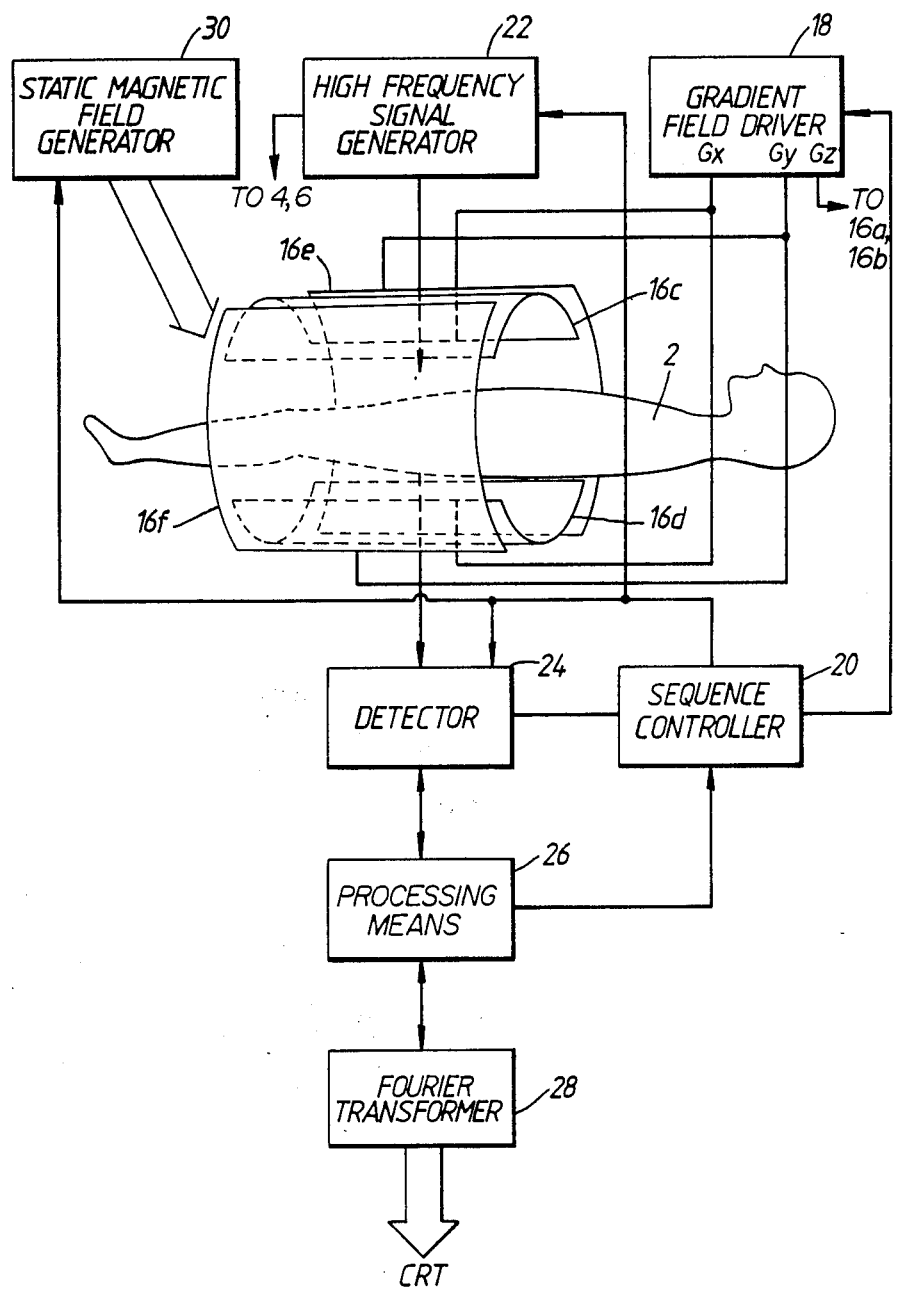
FIG. 3 shows schematically an apparatus for implementing the invention.

FIG. 3 shows an apparatus for performing a method in accordance with the invention. The apparatus comprises coils 16c, 16d, 16e and 16f, gradient field driver 18 for the excitation of the coils 16a, 16b, 16c, 16d, 16e and 16f, respectively, under the control of a sequence controller 20, and a high-frequency signal generator 22 for the excitation of the coils 4 and 6. The apparatus also comprises a high-frequency signal detector 24 connected to receiver coils 8, 10 (FIG. 2), processing means 26 including a sampling circuit, and analog-to-digital converter and a memory, and a Fourier transformer 28 for performing a Fourier transformation. The static magnetic field $B_o$ which has already been described with reference to FIG. 2 is generated by a static magnetic field generator 30 including appropriate coils and electrically connected driver controlled by sequence controller 20. Though only the $G_x$, $G_y$ gradient coils 16c, 16e and 16f are illustrated schematically in FIG. 3, the $G_x$ coils 16c and 16d, and the $G_y$ coils 16e and 16f are two sets of coils axially displaced, each set comprising two pairs of saddle coils the pair (16c, 16d) being positioned at 90° with respect to the pair (16e, 16f). These coils are themselves inserted into the central aperture in the $B_o$ coils as is well known, RF coil sets 4, 6, 8 and 10 are two saddle-shaped coils which are driven in parallel, to provide the rotating RF field by the high-frequency signal generator 22, and also to detect the echo resonance signals, which are of approximately the same frequency, by the high-frequency signal detector 24.

The above-described apparatus is utilized to determine the nuclear magnetization distribution in a body 2 as will be described hereinafter. The method comprises several steps.

The pulse sequence used to form an image from a plurality of the spin-echo signals following separate excitations is shown in FIGS. 4A and 4B. Two modes of operation are employed, a preliminary mode and an image measurement mode.

Preliminary Mode—FIG. 4A

Interval 1. A selective 90° RF pulse is applied simultaneously with a magnetic field gradient $G_z$. This selectively excites nuclear spins in and close to the plane $Z=Z_o$. The value of $Z_o$ can be altered by a change in the frequency of the 90° pulse.

Interval 2. A gradient of the magnetic field having a positive value $G_x$ is applied to dephase the nuclear spins along the X-direction. Simultaneously a smaller signal gradient $G_y(p)$ of the magnetic field is applied to dephase the spins along the axis Y. The value of $G_y(p)$ is selected to be beyond the non-linear range in the gradient power supply, e.g., generally a low value slightly above the zero field value.

Interval 3. A 180° RF pulse is applied simultaneously with a longer $G_z$ gradient pulse to produce echo refocusing. During a part of the period after the 180° pulse, a magnetic field gradient $G_y'(p)$ is applied having a nominal value corresponding to the value of the time integral of the gradient $G_y(p)$.

Interval 4. The echo signal is measured and sampled in the presence of a readout gradient $G_x$ which is applied to cause the spins to rephase and produce a gradient-induced spin echo in the middle of the signal acquisition interval.

Interval 5. A system recovery time is provided until the occurrence of Interval 1 of the next sequence. This should be long compared with the spin-lattice relaxation time T and may be on the order of a second in a whole-body imaging apparatus.

The entire set of steps described above is successively repeated a number of times and in each repetition a different amplitude of the gradient $G_y'(p)$ is utilized with the corresponding measured value of the spin-echo signal stored in the memory of processing means 26. Then, one of the values of the spin-echo signal is selected in accordance with a predetermined criteria. For examaple, the maximum amplitude value of the spin-echo signal may be used as the criteria. The corresponding amplitude of the gradient $G_y'(p)$MAX represents the desired nominal value of the phase encoding gradient used to spatially resolve information along the Y axis. The letter "p" is used as an index for the value of $G_y$ and $G_y'$.

The same procedures are performed for the reverse magnetic gradients $G_y(p)$ and $G_y'(p)$, i.e., oppositely directed gradients. The resultant gradient $G_y'(p)$MAX serves to give a desired amount of twist or "warp" to each vertical column of spins defined by the presence of the gradient $G_x$. In fact it maximizes the response to a particular vertical spatial frequency in the column equal to the spatial frequency of the "warp".

Subsequent to the preliminary mode, the image measurement mode is carried out.

Image Measurement Mode—FIG. 4B

Interval 1. Same as in preliminary mode.

Interval 2. The phase-encoding gradient $G_y(p)$ is applied with different amplitudes but for the same time period to give different integral values. The time period for $G_y(p)$ is the same as that used in the preliminary mode. The minimum of $G_y(p)$, namely, $G_y(0)$, may be same as, or may correspond to, the value $G_y(p)$ used in the preliminary mode.

Interval 3. The same as in the preliminary mode except $G_y'(p)$ is fixed at $G_y'(p)$MAX to correspond to the maximum value of the spin-echo signal.

Intervals 4 and 5. Same as in preliminary mode.

In the measurement step, the utilization of $G_y'(p)$MAX ensures that non-linearities in the local magnetic field resulting from variations in instruments, power supplies, field coils, etc., are cancelled out.

In the measurement mode, the gradients $G_y'(p)$MAX together with the gradient $G_y(0)$ serve to define an imaginary origin or offset for the y field gradient which is unique to each NMR apparatus and is determined for each apparatus during the preliminary mode. After such determination, $G_y(p)$ is varied, and $G_y'(p)$MAX is fixed as shown in FIG. 4B. Variation of $G_y(p)$ permits spin-warp image measurement and image processing to be done in the normal manner.

Figure 5:
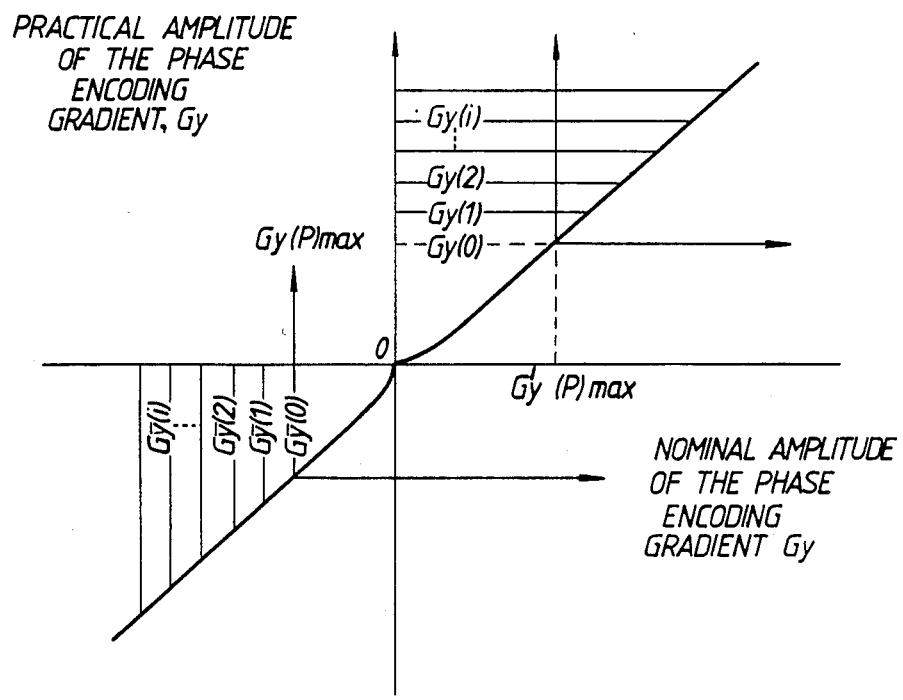
FIG. 5 shows the relationship between the actual or practical amplitude of the phase-encoding gradient, and the range of the nominal amplitude of the gradient used in accordance with the invention.

The value of the nominal (theoretical) amplitude of $G_y(p)$ as a function of the actual or practical value of $G_y(p)$ is shown in FIG. 5. The nonlinearity for low values of $G_y(p)$ around the origin is avoided by requiring $G_y(p)$ to vary only above the imaginary origin or offset $G_y(0)$ and by employing the fixed gradient $G_y'(p)$MAX determined in the preliminary mode.

In accordance with the proposed method, a range of vertical frequencies from zero up to a maximum is a linear function of the $G_y$ linear phase-encoding gradient starting with a value of $G_y'(p)$MAX, thus avoiding the non-linear region of the phase-encoding gradient.

The 2D Fourier transform image is produced by iteration of the pulse sequence each time with a different magnitude $G_y$.

In order to achieve the object of applying a $G_y$ linear phase-encoding gradient, the spin-echo signals are detected by the high-frequency detector 24 in order of the increasing $G_y'(p)$ pulse strengths generated by $G_y$ coils 16e and 16f under control of sequence controller 20. Then, in the processing means (26 in FIG. 3) the time integral value of the $G_y'(p)$ gradient is determined which maximizes the spin-echo signal that is eventually obtained. Information on this value of the phase-encoding gradient is provided to the sequence controller 20 for the image measurement mode which is essentially a data acquisition mode.

While the invention has been described with reference to the preferred embodiments, it is understood that modifications and improvements may readily be made by those skilled in the art and still fall within the spirit and scope of the invention as defined by the appended claims.

What is claimed is:

1. A method of deriving image information from an object using nuclear magnetic resonance signals comprising the steps of:
(A) subjecting an object to a static magnetic field along an axis and performing a set of sequential preliminary steps including:
  (1) selectively exciting nuclear spins in a selected plane in the presence of a first gradient magnetic field oriented along said axis;
  (2) applying a second gradient magnetic field for encoding the phase of the selected spins to spatially resolve information along another axis being orthogonal to the direction of the first axis;
  (3) applying a preliminary third gradient magnetic field having a direction orthogonal to the direction of both the first and second axes;
  (4) applying a 180° RF pulse associated with the first gradient to produce echo refocusing;
  (5) applying an additional preliminary third gradient after said 180° RF pulse;
  (6) removing the additional third gradient;
  (7) applying a further second gradient;
  (8) measuring a spin-echo signal in the presence of said further second gradient;
  (9) repeating the sequence of steps (1)–(8) a plurality of times while applying a different value of the preliminary third gradient each time and while storing the respective measured values of the spin-echo signal;
  (10) selecting one of said stored values of the spin-echo signal in accordance with a predetermined criteria;
  (11) determining the value of said additional preliminary third gradient $G_y'(p)$MAX which corresponds to said selected value of said spin-echo signal; and
(B) subjecting the object to said static magnetic field and performing the measurement steps of:
  (12) selectively exciting nuclear spins in said selected plane in the presence of said first gradient magnetic field;
  (13) applying said second gradient magnetic field;
  (14) applying a third gradient magnetic field having a direction orthogonal to the direction of both the first and second axes;

(15) applying a 180° RF pulse associated with the first gradient to produce echo refocusing;
(16) applying an additional third gradient after said 180° RF pulse, said additional third gradient having a value $G'_y(p)MAX$ determined in said preliminary steps;
(17) removing the additional third gradient;
(18) applying a further second gradient;
(19) measuring a spin-echo signal in the presence of said further second gradient;
(20) repeating the sequence of steps (12)–(19) a plurality of times while applying a different value of the third gradient in step (14) while storing the respective measured values of the spin-echo signals; and
(21) processing the stored values of the spin-echo signal for determining an NMR image of said object.

2. A method as recited in claim 1, wherein step (10) includes the step of selecting the maximum stored value of the spin-echo signal as the predetermined criteria.

3. A method as recited in claim 1 wherein steps (1) and (12) each include the step of applying a 90° RF pulse in the presence of said first gradient.

4. A method of deriving image information from an object using nuclear magnetic resonance signals comprising the steps of:
(A) subjecting an object to a static magnetic field along an axis and performing a set of sequential preliminary steps including:
  (1) selectively exciting nuclear spins in a selected portion of said object in the presence of a first gradient magnetic field $G_z$ oriented along said axis;
  (2) applying a second gradient magnetic field $G_x$ along another axis being orthogonal to the direction of the first axis;
  (3) applying a preliminary third gradient magnetic field $G_y(p)$ having a direction orthogonal to the direction of both the first and second axes;
  (4) applying a 180° RF pulse;
  (5) applying an additional preliminary third gradient $G_y'(p)$ after said 180° RF pulse;
  (6) removing the additional third gradient;
  (7) applying a further second gradient $G_x$;
  (8) measuring a spin-echo signal in the presence of said further second gradient $G_x$;
  (9) repeating the sequence of steps (1)–(8) a plurality of times while applying a different value of the preliminary third gradient $G_y'(p)$ each time and while storing the respective measured values of the spin-echo signal;
  (10) selecting one of said stored values of the spin-echo signal in accordance with a predetermined criteria;
  (11) determining the value of said additional preliminary third gradient $G'_y(p)MAX$ which corresponds to said selected value of said spin-echo signal; and
(B) subjecting the object to said static magnetic field and performing the measurement steps of:
  (12) selectively exciting nuclear spins in said selected portion of said object in the presence of said first gradient magnetic field $G_z$;
  (13) applying said second gradient magnetic field $G_x$;
  (14) applying a third gradient magnetic field $G_y(p)$ having a direction orthogonal to the direction of both the first and second axes;
  (15) applying a 180° RF pulse associated with the first gradient to produce echo refocusing;
  (16) applying an additional third gradient after said 180° RF pulse, said additional third gradient having a value $G'_y(p)MAX$ determined in said preliminary steps;
  (17) removing the additional third gradient;
  (18) applying a further second gradient;
  (19) measuring a spin-echo signal in the presence of said further second gradient $G_x$;
  (20) repeating the sequence of steps (12)–(19) a plurality of times while applying a different value of the third gradient $G_y(p)$ while storing the respective measured values of the spin-echo signals; and
  (21) processing the stored values of the spin-echo signal for determining an NMR image of said object.

5. A method as recited in claim 4, wherein step (10) includes the step of selecting the maximum stored value of the spin-echo signal as the predetermined criteria.

* * * * *